(12) United States Patent
Wu et al.

(10) Patent No.: US 9,269,863 B2
(45) Date of Patent: Feb. 23, 2016

(54) LIGHT-EMITTING APPARATUS

(71) Applicant: EPISTAR CORPORATION, Hsinchu (TW)

(72) Inventors: Chien-Ming Wu, Hsinchu (TW); Wu-Tsung Lo, Hsinchu (TW); Shih-Chang Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/166,642

(22) Filed: Jan. 28, 2014

(65) Prior Publication Data

US 2014/0217359 A1    Aug. 7, 2014

(30) Foreign Application Priority Data

Feb. 4, 2013    (TW) .............................. 102104454 A

(51) Int. Cl.
| H01L 29/06 | (2006.01) |
| H01L 31/00 | (2006.01) |
| H01L 33/10 | (2010.01) |
| H01L 33/14 | (2010.01) |
| H01L 33/04 | (2010.01) |

(52) U.S. Cl.
CPC ................ H01L 33/10 (2013.01); H01L 33/14 (2013.01); H01L 33/04 (2013.01)

(58) Field of Classification Search
CPC ............ H01L 25/0756; H01L 31/0687; H01L 31/0725; H01L 31/076; H01L 33/0079; H01L 33/0095; H01L 33/44; H01L 33/42; H01L 33/04; H01L 33/14; H01L 33/10; Y02E 10/544

USPC ...................... 136/256; 438/64; 257/E31.119
See application file for complete search history.

(56) References Cited

U.S. PATENT DOCUMENTS

| 7,808,005 | B1 * | 10/2010 | Fattal et al. ..................... 257/79 |
| 2004/0042266 | A1 * | 3/2004 | Tamura et al. ................. 365/173 |
| 2008/0190479 | A1 * | 8/2008 | Hsieh et al. .................... 136/246 |
| 2010/0252103 | A1 * | 10/2010 | Yao et al. ....................... 136/256 |
| 2012/0205616 | A1 * | 8/2012 | Zhang et al. .................... 257/13 |
| 2013/0270514 | A1 * | 10/2013 | Saxler ............................. 257/13 |

OTHER PUBLICATIONS

Huang S., and Conibeer G. "Sputter-Grown Si Quantum Dot Nanostructures for Tandem Solar Cells." 2012. Journal of Physics D: Applied Physics. 46, No. 2. 024003.*

* cited by examiner

*Primary Examiner* — Jarrett Stark
(74) *Attorney, Agent, or Firm* — Muncy, Geissler, Olds & Lowe, P.C.

(57) ABSTRACT

The present application discloses a light-emitting apparatus comprising a first light-emitting semiconductor stack, a first intermediate layer formed on the first light-emitting semiconductor stack and a second light-emitting semiconductor stack formed on the first intermediate layer. The first intermediate layer comprises a first conductive semiconductor layer, a second conductive semiconductor layer and an intermediate region. The intermediate region has a discontinuous structure located between the first conductive semiconductor layer and the second conductive semiconductor layer.

12 Claims, 5 Drawing Sheets

LIGHT-EMITTING APPARATUS

RELATED APPLICATION

This application claims priority from previously filed Taiwan Patent Application No. 102104454 filed on Feb. 4, 2013, entitled as "LIGHT-EMITTING APPARATUS", and the entire contents of which are hereby incorporated by reference herein in its entirety.

BACKGROUND

1. Technical Field

The present disclosure relates to a light-emitting apparatus and in particular to a light-emitting apparatus comprising multiple light-emitting semiconductor stacks connected by an intermediate layer.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength so the LEDs have been widely used in various lighting application.

Although the light-emitting diodes (LEDs) have the above benefits, they have the drawbacks like having luminosity lower than that of traditional incandescent lamps. Thus, higher current is provided to LEDs or the quantity of LEDs is increased to provide sufficient luminosity. The higher current suppresses the benefit of low power consumption of the LED and more LEDs occupy more area and consume more energy. Therefore, more efforts are devoted to improving luminance of LEDs for promotion of LEDs in our daily life, such as changing the materials of LED or changing the epitaxy structure in LED.

The LEDs can be connected to other elements to form a light-emitting device. The light-emitting device comprises a sub-mount with circuit, a solder on the sub-mount to fix the light-emitting diode on the sub-mount and to electrically connect the base of the light-emitting diode and the circuit of the sub-mount, and an electrical connection structure electrically connecting the electrode pad of the light-emitting diode and the circuit of the sub-mount wherein the above sub-mount can be a lead frame or a large size mounting substrate for circuit design of the light-emitting device and improving its heat dissipation.

SUMMARY OF THE DISCLOSURE

A light-emitting apparatus comprising a first light-emitting semiconductor stack, a first intermediate layer on the first light-emitting semiconductor stack and a second light-emitting semiconductor stack on the first intermediate layer. The first intermediate layer comprises a first conductive semiconductor layer, a second conductive semiconductor layer and a first intermediate region, wherein the first intermediate region comprises a discontinuous structure between the first conductive semiconductor layer and the second conductive semiconductor layer.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1:
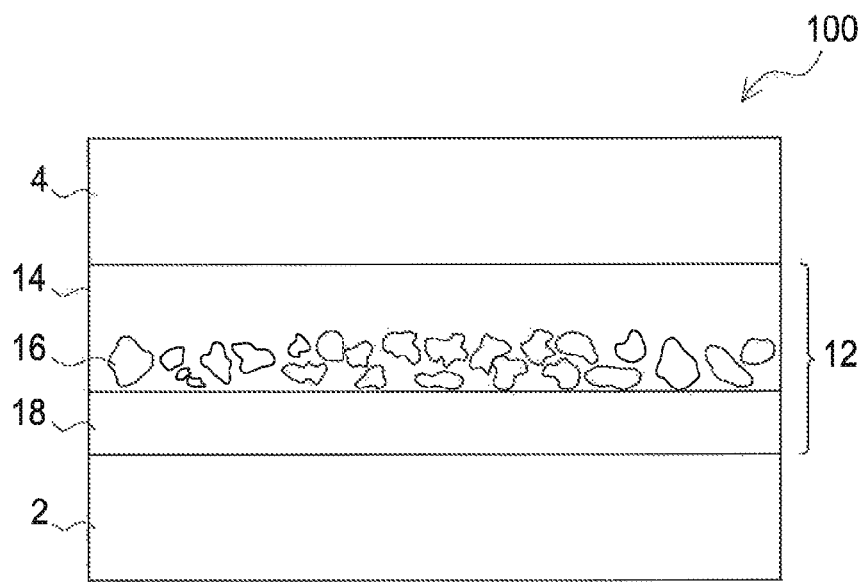
FIG. 1 shows an embodiment of a light-emitting semiconductor stack in accordance with a first embodiment of the present disclosure.

FIG. 1 shows a cross-sectional view of the light-emitting apparatus 100 in accordance with the first embodiment of this application. The light-emitting apparatus 100 comprises a first light-emitting semiconductor stack 2, an intermediate layer 12 and a second light-emitting semiconductor stack 4 wherein the wavelength of the light emitted by the first light-emitting semiconductor stack 2 can be substantially the same as or be different from that emitted by the second light-emitting semiconductor stack 4. The intermediate layer 12 further comprises a first conductive semiconductor layer 14, an intermediate region 16 and a second conductive semiconductor layer 18, wherein the intermediate region 16 is located between the first conductive semiconductor layer 14 and the second conductive semiconductor layer 18. In this embodiment, the conductive type and the material of the first conductive semiconductor layer 14 and the second conductive semiconductor layer 18 in the intermediate layer 12 are different. The first conductive semiconductor layer 14 and the second conductive semiconductor layer 18 comprise element of III-V group; for example, the material in first conductive semiconductor layer 14 is AlGaAs and the material in second conductive semiconductor layer 18 is InGaP or GaAs.

Figure 2:
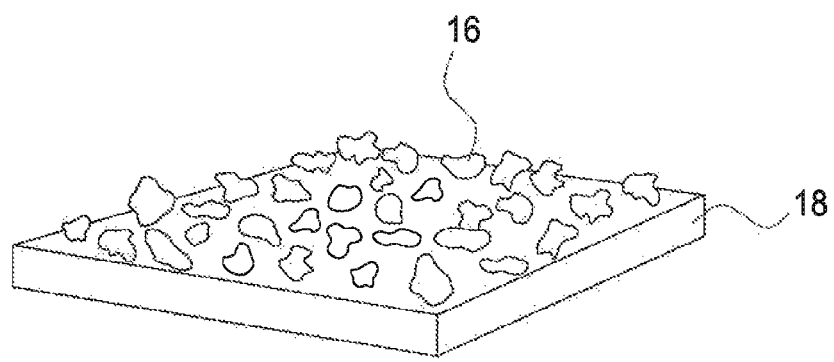
FIG. 2 shows an intermediate layer in accordance with an embodiment of the present disclosure.

As shown in FIG. 1, according to the cross-sectional view, the intermediate region 16 has multiple discontinuous structures irregularly located on the second conductive semiconductor layer 18. As shown in FIG. 2, the intermediate region 16 does not fully cover the second conductive semiconductor layer 18 but covers only a part of the second conductive semiconductor layer 18. Thus, the first conductive semiconductor layer 14 and the second conductive semiconductor layer 18 are connected through the part not covered by the intermediate region 16. Because the conductive types of the first conductive semiconductor layer 14 and the second conductive semiconductor layer 18 are different, the electrons and holes are combined in the region wherein the two conductive layers are connected to form a space charge region. The electric field formed by the space charge region accelerates the electrons flowing through the intermediate layer 12 and increases the amount of current passing per time unit.

In this embodiment, the irregularly located discontinuous structures in the intermediate region 16 can be a quantum dot structure, that is, any two of the quantum dot structures in the intermediate region 16 are discontinuous in three dimensional directions. A quantum dot structure can be formed on the second conductive semiconductor layer 18 by a method such as metal-organic chemical vapor deposition (MOCVD), molecular beam epitaxy (MBE), liquid phase epitaxy (LPE) and vapor phase epitaxy (VPE). The moving of electrons within a quantum dot structure is restricted by the size of the quantum dot structure so the quantum confinement effect is obvious. Depending on the motion of an electron, the motion of an electron is further restricted in the structure with the reduction of the size of the structure. While the movement of an electron is restricted in three directions, the structure is considered as a quantum dot structure. Based on a preliminary classification, when each of the sizes of a structure in three dimensions is under 100 nm, the structure can be substantially considered as a quantum dot structure. Thus, each of the sizes of the quantum dot structures in the intermediate region 16 is at least under 100 nm. A further specific classification is based on the Fermi wavelength of an electron in the material, and a structure is considered as a quantum structure when each of the sizes of a structure in three dimensions is smaller than a Fermi wavelength. Nevertheless, the Fermi wavelength varies with the materials, for example, the Fermi wavelength of GaAs is 40 nm and the Fermi wavelength of Al is 0.36 nm. Under this condition, take the structure composed of silicon in accordance with the application as an example, because the Fermi wavelength of silicon is 4.9 nm, each of the sizes of a quantum dot structure within the intermediate region 16 in three dimensions is not larger than 4.9 nm.

In an embodiment of this application, the first light-emitting semiconductor stack 2 and the second light-emitting semiconductor stack 4 are connected by the intermediate layer 12. Because the intermediate layer 12 comprises an intermediate region 16, the current is not only affected by the electric field of the space charge region while passing through the first conductive semiconductor layer 14 and the second conductive semiconductor layer 18 but also affected by the quantum dot structure which increases the possibility of an electron passing through the intermediate region 12 so the tunneling effect is induced and more electrons are moving from one light-emitting semiconductor stack to another. That is, the density of electrons passing through the intermediate layer 12 over a period is increased, which is equally to the increase of the amount of current passing through the intermediate layer 12, and the light-emitting efficiency of the light-emitting apparatus 100 is improved.

Figure 3:
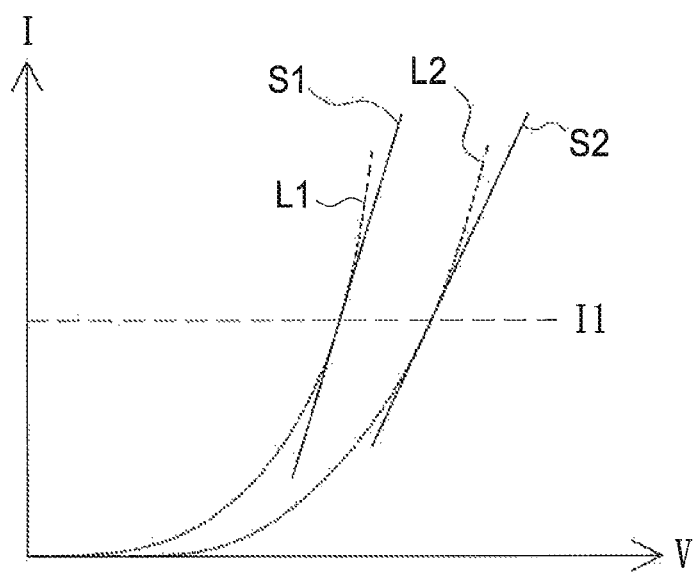
FIG. 3 shows the influence of operating voltage and operating current arisen from the intermediate layer in accordance with an embodiment of the present disclosure.

FIG. 3 shows the influence of the intermediate layer 12 on the operating voltage and operating current of the light-emitting apparatus 100 in accordance with an embodiment of the present disclosure. Line L2 represents the relation curve of the operating current and the operating voltage of a light-emitting apparatus 100 without intermediate layer 12. Line L1 represents the relation curve of the operating current and the operating voltage of a light-emitting apparatus 100 with intermediate layer 12. When the light-emitting apparatus 100 is operated under current I1, line L1 indicating the presence of the intermediate layer 12 has a slope S1 larger than the slope S2 of line L2, which means lower operation voltage is provided to an apparatus (represented by line L1) for larger current compared with the other apparatus (represented by line L2) without an intermediate layer. Besides, when the operating current or the operating voltage is larger, the difference of corresponding operating voltages and operating currents of the line L1 and line L2 are larger, which means the light-emitting apparatus 100 has a larger tunneling current and the series resistance within the light-emitting apparatus 100 is reduced by the intermediate layer 12 which has a quantum dot structure with sizes restricted in three dimensions.

In the light-emitting apparatus 100 in accordance with the embodiment of this application, the surface of the second light-emitting semiconductor stack 4 opposing to the intermediate layer 12 is used as a light extraction surface. In order to increase the light-emitting efficiency, a reflective layer (not shown in the figure) is formed on a surface of the first light-emitting semiconductor stack 2 opposing to the intermediate layer 12, wherein the reflective layer can be a metal reflective layer or a distributed Bragg reflector (DBR) layer to reflect light from the first light-emitting semiconductor stack 2 to the second light-emitting semiconductor stack 4. Besides, a transparent conductive layer (not shown in the figure) is formed on a surface of the second light-emitting semiconductor stack 4 as a window layer where the light is extracted to increase the amount of light extracted by the window layer. The material of the window layer can be a conductive material, such as ITO. When the window layer comprises conductive material, an electrode layer is optionally formed on the window layer and a contact layer is then formed between the electrode layer and the window layer to form an Ohmic contact and decrease the resistance between the electrode layer and the window layer.

Figure 4:
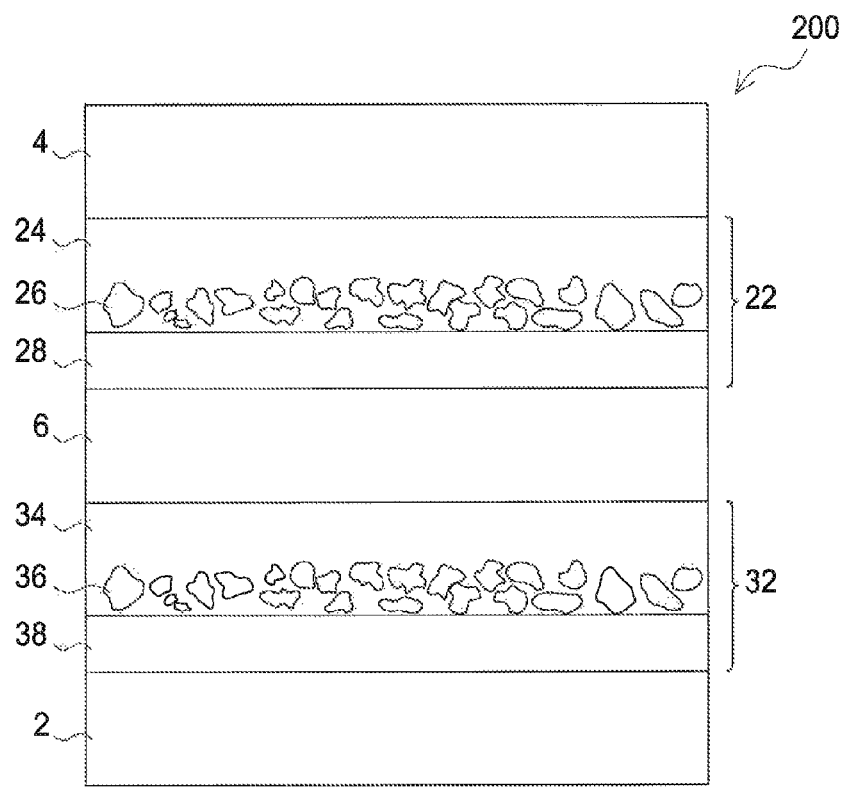
FIG. 4 shows a cross-sectional view of the light-emitting apparatus in accordance with the second embodiment of the present disclosure.

FIG. 4 shows a cross-sectional view of the light-emitting apparatus 200 in accordance with the embodiment of this application. The light-emitting apparatus 200 comprises a first light-emitting semiconductor stack 2, a first intermediate layer 22, a second light-emitting semiconductor stack 4, a second intermediate layer 32 and a third light-emitting semiconductor stack 6, wherein the wavelength of the light emitted by the first light-emitting semiconductor stack 2, the wavelength of the light emitted by the second light-emitting semiconductor stack 4 and the wavelength of the light emitted by the third light-emitting semiconductor stack 6 can be about the same or different from each other. The third light-emitting semiconductor stack 6 is between the first light-emitting semiconductor stack 2 and the first intermediate layer 22, and the first intermediate layer 22 comprises a first conductive semiconductor layer 24, a second conductive semiconductor layer 28 and a first intermediate region 26 between two conductive semiconductor layers. The second intermediate layer 32 is located between the first light-emitting semiconductor stack 2 and the third light-emitting semiconductor stack 6. The second intermediate layer 32 comprises a third conductive semiconductor layer 34, a fourth conductive semiconductor layer 38 and a second intermediate layer 36 between the two conductive semiconductor layers. The third conductive semiconductor layer 34 and the fourth conductive semiconductor layer 38 comprise an element of III-V group, for example, the third conductive semiconductor layer 34 comprises AlGaAs and the fourth conductive semiconductor layer 36 comprises InGaP or GaAs. As shown in FIG. 4, the first intermediate region 26 in the first intermediate layer 22 and the second intermediate region 36 in the second intermediate layer 32 respectively comprise a discontinuous structure, such as a quantum dot structure.

Figure 5:
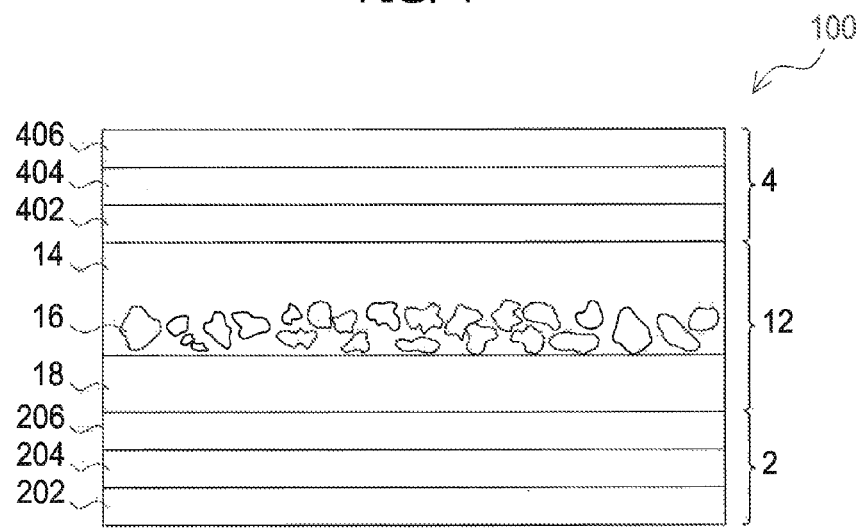
FIG. 5 shows the light-emitting semiconductor stack in accordance with the first embodiment and the second embodiment of the present disclosure.

The first light-emitting semiconductor stack 2 and the second light-emitting semiconductor stack 4 in the light-emitting apparatus 100 in accordance with the embodiment of the application is depicted with more details in FIG. 5. The first light-emitting semiconductor stack 2 comprises a fifth conductive semiconductor layer 202, a light-emitting layer 204 and a sixth conductive semiconductor layer 206. The second light-emitting semiconductor stack 4 comprises a seventh conductive semiconductor layer 402, a light-emitting layer 404 and an eighth conductive semiconductor layer 406. In this embodiment, the fifth conductive semiconductor layer 202 and the seventh conductive semiconductor layer 402 are n-type semiconductor layers; the sixth conductive semiconductor layer 206 and the eighth conductive semiconductor layer 406 are p-type semiconductor layers. The first conductive semiconductor layer 14 and the second conductive semiconductor layer 18 are n-type semiconductor layers. Then, the conductive type of the conductive semiconductor layer in the intermediate layer 12 and the conductive semiconductor layer in adjacent light-emitting semiconductor stacks are the same. In this embodiment, the first conductive semiconductor layer 14 in the intermediate layer 12 can be an n-type AlGaAs layer and the second conductive semiconductor layer 18 can be a p-type InGaP or a p-type GaAs. Based on the embodiments in the application, two or more light-emitting semiconductor stacks are placed on a surface having an area originally designed for one light-emitting semiconductor stack so the amount of light emitted per area is increased. As mentioned above, when the two light-emitting semiconductor stacks respectively emits a visible light having a wavelength of visible light range while the two lights have the same color, more light is provided with the same (bottom) area which is of much benefit to lighting purpose. When the first light-emitting semiconductor stack 2 and the second light-emitting semiconductor stack 4 are designed to emit visible lights with different colors, the different color lights are mixed to form a required light. For example, the red light emitted by the first light-emitting semiconductor stack 2 and the blue light emitted by the second light-emitting semiconductor stack 4 are mixed to form a purple light. Moreover, wavelength converting materials such as a phosphor can be added to turn the blue light emitted by the second light-emitting semiconductor stack 4 to yellow light; the yellow light, blue light and the red light are mixed to form warm white light. The wavelength converting material can be formed on the light-emitting semiconductor stack or distributed in the package which seals the first light-emitting semiconductor stack 2 and the second light-emitting semiconductor stack 4.

Figure 6A:
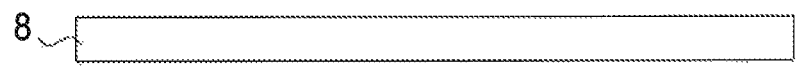
FIGS. 6A-6D show the process flow of a light-emitting apparatus in accordance with the third embodiment of the present disclosure.
Figure 6B:
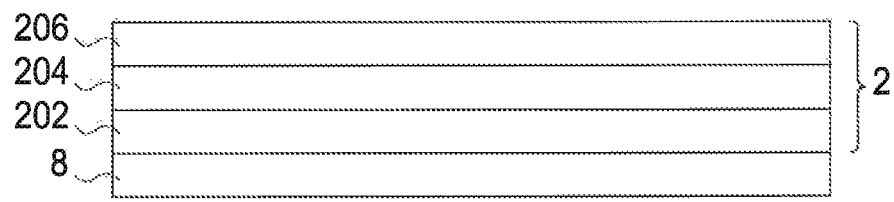
Figure 6C:
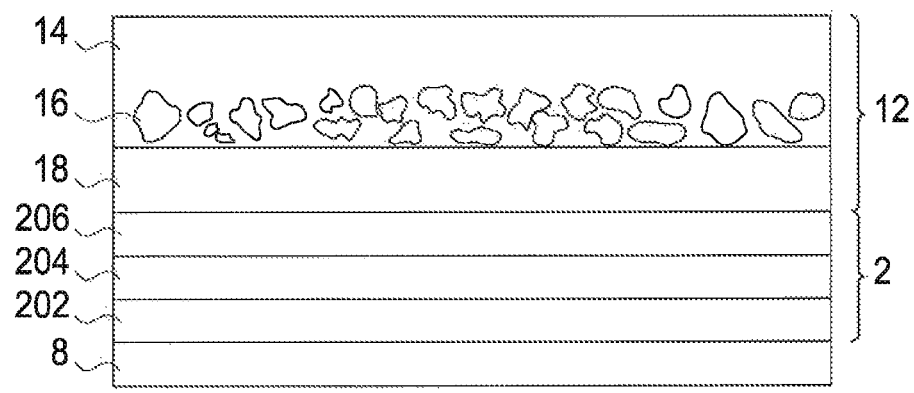
Figure 6D:
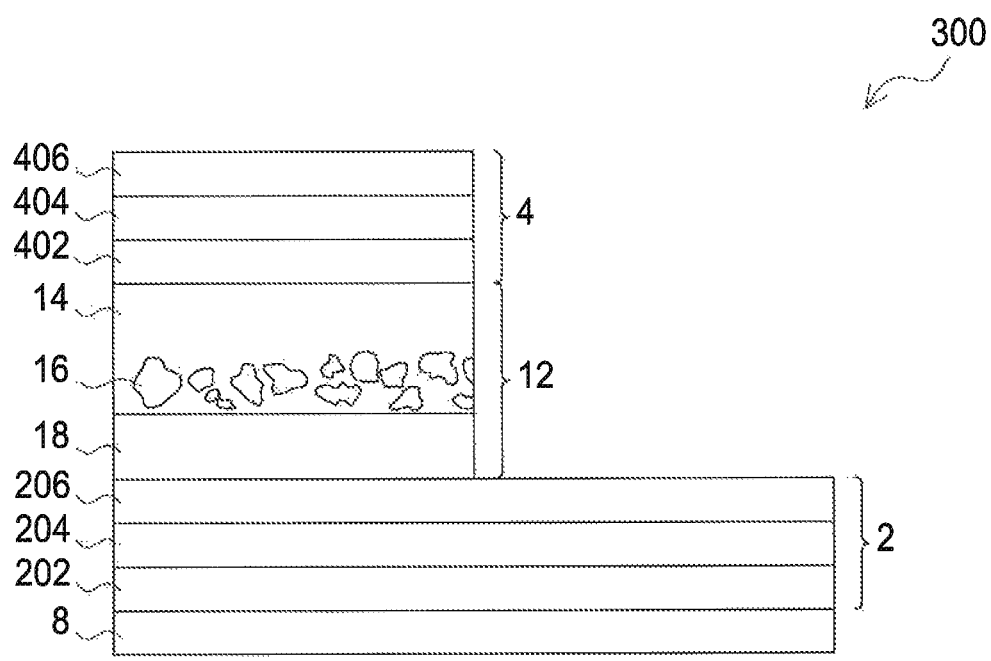

FIGS. 6A-6D show the process flow of a light-emitting apparatus 300 in accordance with another embodiment of the present application. As shown in FIG. 6A, a substrate 8 is provided wherein the material of the substrate 8 comprises metal such as Ge or metal compound comprises an element such as Ga, As, Si, C, P, Al, N, I, Zn, O, Li or the combination of these elements. The substrate 8 can be an electrically insulated substrate, such as a sapphire substrate or a ceramic substrate for heat conducting and electrical insulation. When the substrate 8 is a conductive substrate, an electrode layer is directly formed on a surface of the substrate 8 opposing to the surface for epitaxy growth. Then, the first light-emitting semiconductor stack 2 is formed on the substrate 8 as shown in FIG. 6B. Besides forming a fifth conductive semiconductor layer 202, a light-emitting layer 204 and a sixth conductive semiconductor layer 206 in sequence, a reflective layer is optionally formed between the fifth conductive semiconductor layer 202 and the substrate 8 to reflect part of the light emitted from the light-emitting layer 204 toward the substrate 8 in a direction toward the sixth conductive semiconductor layer 206; or a regularly or irregularly rough surface is formed on a surface of the sixth conductive semiconductor layer 206 opposing to the substrate 8 for improving light extraction. Then, an intermediate layer 12 is formed on the first light-emitting semiconductor stack 2 and the intermediate layer 12 comprises a first conductive semiconductor layer 14, an intermediate region 16, and a second conductive semiconductor layer 18 as shown in FIG. 6C. Then, a second light-emitting semiconductor stack 4 is formed on the intermediate layer 12, wherein the second light-emitting semiconductor stack 4 comprises a seventh conductive semiconductor layer 402, a light-emitting layer 404 and an eighth conductive semiconductor layer 406. Selective etching process is performed to remove a part of the intermediate layer 12 and the second light-emitting semiconductor stack 4 to expose a part of the surface of the first light-emitting semiconductor stack 2 as shown in FIG. 6D. Furthermore, a rough surface or a patterned surface is formed on the surface of the eighth conductive semiconductor layer 406 by etching process or other methods. Or, a reflective layer (not shown in the figure) is formed on the intermediate layer 12 before forming the second light-emitting semiconductor stack 4 for improving light extraction.

In order to perform the process of selectively etching to expose a part of the surface of the first light-emitting semiconductor stack 2, an etching stop layer (not shown in the figure) is selectively formed before the intermediate layer 12, and an intermediate layer 12 is formed on the etching stop layer to fully cover the first light-emitting semiconductor stack 2. After the intermediate layer 12 and the second light-emitting semiconductor stack 4 are formed, etching the second light-emitting semiconductor stack 4 and the intermediate layer 12 until a part of the etching stop layer (not shown in the figure) on the first light-emitting semiconductor stack 2 is exposed as shown in FIG. 6D.

The light-emitting apparatus 400 further comprises an electrode layer or a combination of a contact layer and an electrode layer on the eighth conductive semiconductor layer 406 for introducing operating current. Accordingly, an electrode layer is optionally formed on the sixth conductive semiconductor layer 206 for introducing operating current. When the substrate 8 is a conductive substrate, an electrode layer (not shown in the figure) is formed on a surface of the substrate 8 opposing to first light-emitting semiconductor stack 2. When the substrate 8 is an insulating substrate, a conductive (not shown in the figure) is then formed on the first light-emitting semiconductor stack 2 after removing the substrate 8, and an electrode layer is formed on a surface of the conductive substrate opposing to the first light-emitting semiconductor stack 2.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting apparatus, comprising
 a first light-emitting semiconductor stack;
 a first intermediate layer formed on the first light-emitting semiconductor stack and comprising a first conductive semiconductor layer, a second conductive semiconductor layer, and a first intermediate region comprising a plurality of separated solid structures formed on the first conductive semiconductor layer and covered by the second conductive semiconductor layer; and
 a second light-emitting semiconductor stack formed on the first intermediate layer,
 wherein one of the plurality of separated solid structures has a Fermi wavelength and a size smaller than the Fermi wavelength, and wherein the conductive types of the first conductive semiconductor layer and the second conductive semiconductor layer are different.

2. The light-emitting apparatus of claim 1, wherein the first conductive semiconductor layer or the second conductive semiconductor layer comprises a compound of III-V group.

3. The light-emitting apparatus of claim 2, wherein the first conductive semiconductor layer comprises AlGaAs, the second conductive semiconductor layer comprises InGaP or GaAs.

4. The light-emitting apparatus of claim 1, wherein the first intermediate region comprises a plurality of quantum dots comprising silicon.

5. The light-emitting apparatus of claim 1, further comprising a first electrode layer electrically connected to the first light-emitting semiconductor stack and a second electrode layer electrically connected to the second light-emitting semiconductor stack.

6. The light-emitting apparatus of claim 1, further comprising a third light-emitting semiconductor stack between the first light-emitting semiconductor stack and the first intermediate layer.

7. The light-emitting apparatus of claim 6, further comprising a second intermediate layer between the third light-emitting semiconductor stack and the first light-emitting semiconductor stack.

8. The light-emitting apparatus of claim 7, wherein the second intermediate layer comprises a third conductive semiconductor layer and a fourth conductive semiconductor layer.

9. The light-emitting apparatus of claim 8, wherein the third conductive semiconductor layer and the fourth conductive semiconductor layer comprise a compound of III-V group.

10. The light-emitting apparatus of claim 9, wherein the third conductive semiconductor layer comprises AlGaAs, the fourth conductive semiconductor layer comprises InGaP and GaAs.

11. The light-emitting apparatus of claim 8, wherein the second intermediate layer further comprises a second intermediate region having a discontinuous structure, between the third conductive semiconductor layer and the fourth conductive semiconductor layer.

12. The light-emitting apparatus of claim 11, wherein the second intermediate region comprises a plurality of quantum dots comprising silicon.

\* \* \* \* \*